United States Patent [19]

Morgan

[11] Patent Number: 5,442,837
[45] Date of Patent: Aug. 22, 1995

[54] INTEGRATED END STOPS FOR ZIPPER SLIDER

[75] Inventor: Kevin P. Morgan, Fairport, N.Y.

[73] Assignee: Mobil Oil Corporation, Fairfax, Va.

[21] Appl. No.: 262,713

[22] Filed: Jun. 20, 1994

[51] Int. Cl.6 .................................................. A44B 19/00
[52] U.S. Cl. ...................................... 24/400; 24/418; 24/430; 24/587
[58] Field of Search ................ 24/400, 399, 587, 389, 24/430, 427, 418; 383/63, 65, 69

[56] References Cited

U.S. PATENT DOCUMENTS

| | | |
|---|---|---|
| 2,287,349 | 6/1942 | Hirsch .................................. 24/418 |
| 3,103,049 | 9/1963 | Hawley . |
| 3,122,807 | 3/1964 | Ausnit . |
| 3,220,076 | 11/1965 | Ausnit et al. . |
| 3,259,951 | 7/1966 | Zimmerman . |
| 3,347,298 | 10/1967 | Ausnit et al. . |
| 3,426,396 | 2/1969 | Laguerre . |
| 3,462,332 | 8/1969 | Goto . |
| 3,579,747 | 5/1971 | Hawley . |
| 3,660,875 | 5/1972 | Gutman . |
| 3,713,923 | 1/1972 | Laguerre . |
| 3,790,992 | 2/1974 | Herz . |
| 3,806,998 | 4/1974 | Laguerre . |
| 4,262,395 | 4/1981 | Kosky . |
| 4,517,710 | 5/1985 | Beckmann . |
| 4,736,451 | 4/1988 | Ausnit . |
| 4,825,514 | 5/1989 | Akeno ............................... 24/387 X |
| 5,020,194 | 6/1991 | Herrington et al. ................. 24/400 |
| 5,067,208 | 11/1991 | Herrington, Jr. et al. ........... 24/400 |
| 5,161,286 | 11/1992 | Herrington, Jr. et al. ........... 24/400 |
| 5,189,764 | 3/1993 | Herrington ......................... 24/387 |
| 5,301,395 | 4/1994 | Richardson et al. ................ 24/400 |

Primary Examiner—Victor N. Sakran
Attorney, Agent, or Firm—Alexander J. McKillop; Malcom D. Keen; L. Gene Wise

[57] ABSTRACT

A leakproof plastic zipper with integrated end stops for a zipper slider particularly suited for thermoplastic bags. An increased flange height above the interlocking elements of the zipper and an increased plow depth on the separator of the slider extending down between the flanges provide a means of stopping the travel of the slider past the ends of the zipper. The separator structure depending from the slider has a configuration in vertical cross-section corresponding to an inverted T, the horizontal portion of the T having the ends thereof adapted to be received in window structure in the flanges above the interlocking elements and adjacent one of the integrated end stops.

4 Claims, 2 Drawing Sheets

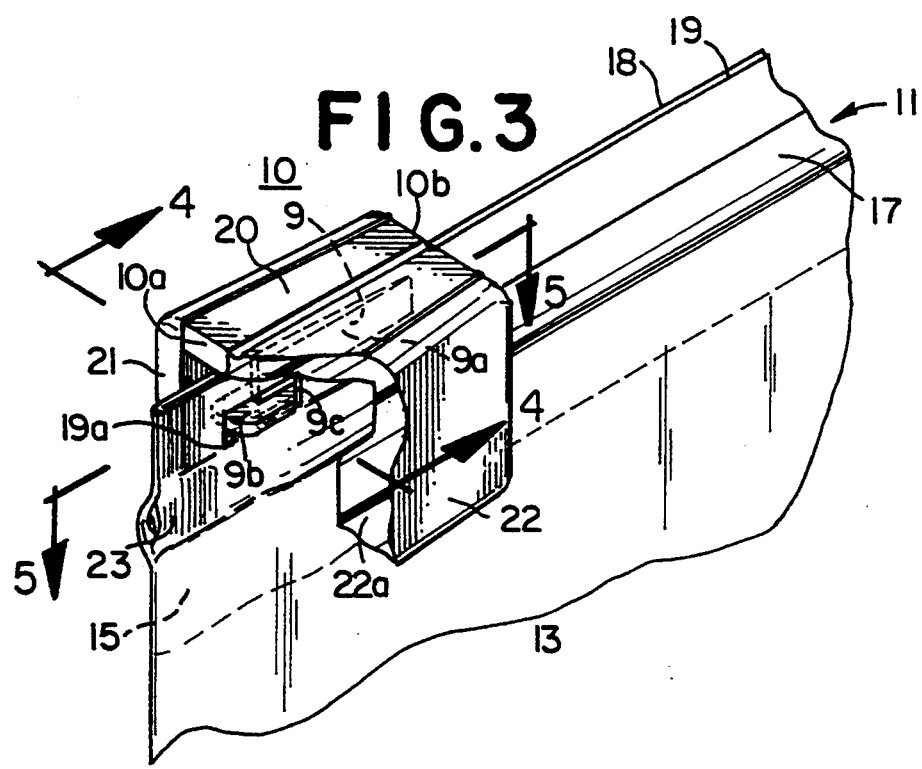
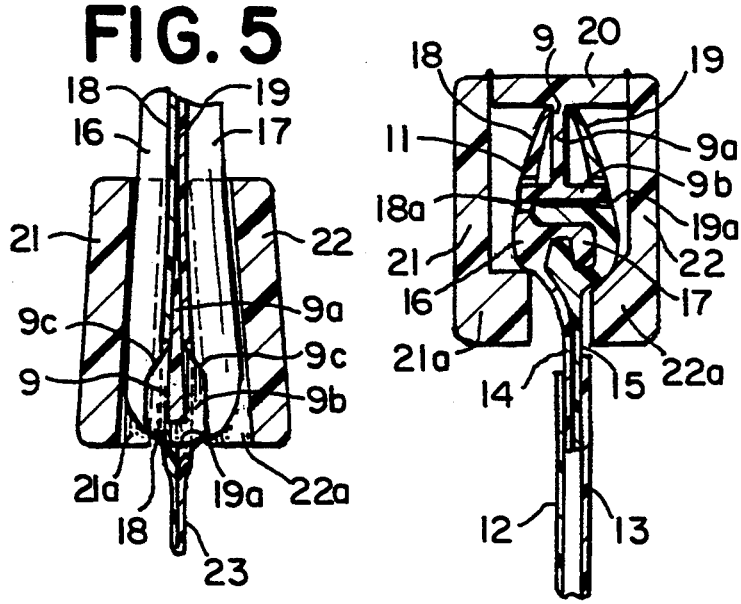

5,442,837

INTEGRATED END STOPS FOR ZIPPER SLIDER

BACKGROUND OF THE INVENTION

The present invention relates to improvements in plastic reclosable fasteners or zippers with sliders for opening and closing the zippers on plastic-film bags and the like and particularly to a provision of a leakproof plastic zipper with integrated end stops for the zipper slider at the ends of the plastic zipper to seal the ends of the zipper and to provide stops to retain the slider on the zipper.

Plastic reclosable fasteners or zippers with sliders are well known in the art. The plastic zippers include a pair of male and female fastener elements in the form of reclosable interlocking rib and groove profile elements for cooperation with the slider for opening and closing the rib and groove elements. In the manufacture of plastic-film bags, a pair of these male and female profile elements extend along the mouth of the bag and are secured in any suitable manner to the flexible walls of the plastic-film bag. These zipper elements may be integral marginal portions of such walls or they may be extruded separately and thereafter attached to the walls along the mouth of the bag.

Various arrangements have been utilized heretofore to provide a leakproof plastic zipper and to prevent the slider from sliding off the end of the zipper. One arrangement is disclosed in U.S. Pat. No. 3,259,951—Zimmerman. In this patent, opposing interlocking or mating strips are permanently joined or sealed to each other at the ends with a separate stop member sealed between these members to stop the longitudinal movement of the slider therealong. The strips are notched at one end to receive the separating member of the slider. Another leakproof zipper with slider is disclosed in U.S. Pat. No. 5,020,194—Herrington et al. In this patent, the zipper structure is slit or notched locally at the end where the slider goes when the zipper is closed to allow the rib and groove elements to interlock fully making a leakproof closure. The U.S. Pat. No. 5,088,971—Herrington and U.S. Pat. No. 5,131,121—Herrington et al disclose end stops that are created from existing material of the profile rib and groove elements at the opposite ends of the zipper, and that protrude transversely from the zipper a distance adequate to engage the sides of the slider and thus prevent movement of the slider past the respective ends of the bag. In U.S. Pat. No. 5,161,286—Herrington et al end clamps are located at the opposite ends of the zipper. A pair of end clamp members is connected together by a flexible strap which extends over the top of the zipper and by a rivet that extends through the pair of end clamp members and the sidewalls of the bag below the profile rib and groove elements of the zipper to secure the end clamp members to the bag. In U.S. Pat. No. 5,067,208—Herrington et al the plastic reclosable fastener and slider include end clamp members and a provision for restraining the slider in closed position and maintaining the male and female elements of the fastener in interlocking relation when the slider reaches the closed end of its travel along the tracks of the slider.

It would be desirable to provide a leakproof plastic zipper with integrated end stops for the zipper slider wherein the volume of material available at the ends of the rib and groove elements is not only adequate for forming integrated end stops without the need for end clamp members but is also adequate to include window structure for receiving the separator finger on the slider thus allowing the interlocking elements to close completely beneath the slider and create a leakproof seal. It would also be desirable to have the window create a "detent" effect in the closed position to maintain the slider in the closed position.

RELATED APPLICATIONS

Fused plastic end clips for zippers are disclosed in the related application entitled "Plastic End Clips Fused to Plastic Zipper" Ser. No. 08/074,576, filed Jun. 10, 1993 by Fox J. Herrington and assigned to the same assignee as the present application. Tubular plastic end stops for a plastic zipper are disclosed in the related application entitled "Tubular Plastic End Stops Bonded to Plastic Zipper" Ser. No. 08/155,365, filed Nov. 22, 1993 by Dale S. Richardson and Roger W. Smith and assigned to the same assignee as the present application.

SUMMARY OF THE INVENTION

It is an object of the present invention to provide an improved leakproof plastic zipper with integrated end stops for the zipper slider.

The present invention relates to a leakproof plastic zipper with integrated end stops for a zipper slider particularly suited for thermoplastic bags and the like. The zipper comprises a pair of flexible plastic strips having separable fastener means extending along the length thereof comprising reclosable interlocking rib and groove profile elements on the respective strips. The strips each include profiled flange structure extending along the length thereof parallel to the rib and groove elements. A straddling slider is positioned on the strips for closing or opening the reclosable rib and groove elements comprising an inverted U-shaped plastic member having a back for moving along the top edges of the strips with depending sidewalls projecting therefrom for maintaining the flange structure and the rib and groove elements therebetween. The slider includes separator structure depending from the back and inserted between the flange structure to open the rib and groove elements. The sidewalls of the slider extend from an opening end of the slider to a closing end with the sidewalls being spaced wider apart at the opening end to permit separation of the rib and groove elements and being spaced sufficiently close together at the closing end to press the rib and groove elements into interlocking relationship as the slider is moved in a zipper closing direction. The flange structure and the rib and groove elements are vertically sealed together at both ends of the pair of strips to maintain the zipper closed at the ends and to provide integrated end stops for the zipper slider. Window structure is provided in the flange structure beneath the top thereof and above the rib and groove elements and adjacent one of the end stops. The window structure is dimensioned to receive the separator structure at the opening end of the slider whereby when the slider is moved in the zipper closing direction, the interlocking rib and groove elements are closed throughout the length of the strips by the closing end of the slider and the separator structure at the opening end of the slider is received in the window structure and thus is ineffective on the flange structure to maintain open the interlocking rib and groove elements thereby to prevent leakage through the zipper. In one aspect of the invention the separator structure depending from the back of the slider has a configuration in vertical cross-section corresponding to an inverted T, the horizontal portion of the T having the ends thereof adapted to be received in the window structure. In accordance with a further aspect of the invention, the horizontal portion of T is shaped to aid in release of the T shaped portion of the slider from the window structure when the slider is moved in the zipper opening direction.

BRIEF DESCRIPTION OF THE DRAWINGS

FIG. 3 is a fractional perspective view similar to FIG. 1 showing the slider at the closed end of the zipper adjacent the integrated end stop.

FIG. 4 is a sectional view taken along the lines 4—4 in FIG. 3.

FIG. 5 is a sectional view taken along the lines 5—5 in FIG. 3 showing the separator structure that is inserted in the window in the zipper flanges.

PREFERRED EMBODIMENT OF THE INVENTION

Figure 1:
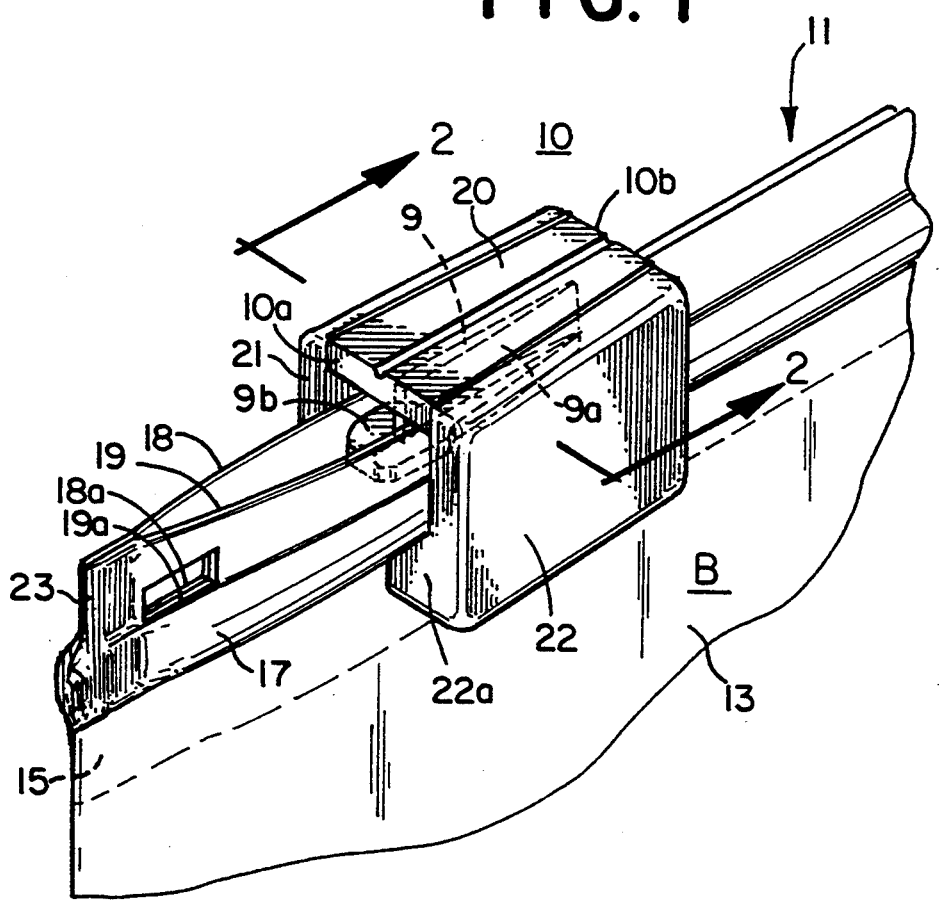
FIG. 1 is a fractional perspective view of a leakproof plastic zipper with an integrated end stop for a zipper slider mounted on a thermoplastic bag embodying the present invention.

Referring to FIG. 1, there is illustrated a plastic slider 10 and a profiled plastic reclosable fastener or zipper 11 embodying the present invention. The slider 10 and zipper 11 are particularly suited for thermoplastic bags and the like and the slider 10 has been illustrated in FIGS. 1-4 assembled on the zipper 11 at the top end or mouth of a thermoplastic bag B. The bag B may be made from any suitable thermoplastic film such for example as polyethylene or polypropylene or equivalent material. The bag B is formed by a pair of flexible plastic sheets 12 and 13, FIG. 2, joined at the bottom and having a top edge, with a pair of flexible plastic strips 14 and 15 having separable plastic means extending along the length thereof comprising reclosable interlocking male and female profile elements in the form of rib and groove elements 16 and 17 on the respective strips to form the zipper 11. The strips 14 and 15 may be extruded separately and attached to the respective sides of the bag mouth or the strips 14 and 15 may be extruded integral with the sides of the bag mouth. The strips 14 and 15 include profiled flanges or tracks 18 and 19 extending along the length thereof parallel to the rib and groove elements 16 and 17. The profiled flanges 18 and 19 have substantial depth the purpose of which will hereinafter be pointed out. The rib and groove profiles 16, 17 may be of the type disclosed in the U.S. Pat. No. 5,007,143.

As may be seen in FIGS. 1-4, the slider 10 straddles the zipper 11 at the top of the bag B and is adapted for opening or closing the reclosable fastener elements 16 and 17 of the zipper 11. The slider 10 may be formed from a single piece of molded plastic comprising a separator structure 9 and interlocking complementary structure for moving along the zipper 11. The separator structure 9 is of novel construction and cooperates with the zipper 11 in such a manner as to provide a self-locking feature for the slider and a leakproof bag as hereinafter to be described in more detail. The slider 10 may be of similar construction to the slider disclosed in the aforesaid U.S. Pat. No. 5,067,208 except for the construction of the separator structure 9. The slider 10 may be molded from any suitable plastic such, for example, as nylon, polypropylene, polystyrene, Delrin or ABS.

Figure 2:
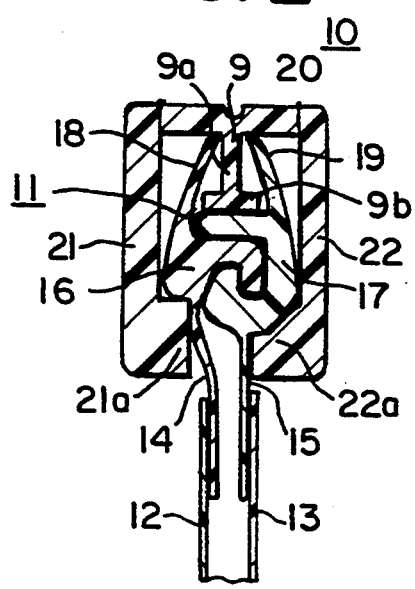
FIG. 2 is a sectional view taken along the lines 2—2 in FIG. 1.

The slider 10 comprises an inverted U-shaped plastic member having a back 20 for moving along the top edges of the flange structure 18 and 19 with depending side walls 21 and 22 projecting therefrom for maintaining the flange structure 18 and 19 and the rib and groove elements 16 and 17 therebetween. The sidewalls 21 and 22 preferably are pivoted at their upper ends to the back member 20 and at their lower ends have inwardly extending shoulders 21a and 22a to maintain the slider 10 on the zipper. This is best seen in FIG. 2. As shown in FIG. 1, the sidewalls 21 and 22 extend from an opening end 10a of the slider to a closing end 10b with the sidewalls 21 and 22 being spaced wider apart at the opening end 10a to permit separation of the rib and groove elements 16 and 17 and being spaced sufficiently close together at the closing end 10b to press the rib and groove elements 16 and 17 into interlocking relationship as the slider 10 is moved in a zipper closing direction. The slider 10 includes separator structure 9 depending from the back 20 and inserted between the flange structure 18 and 19 to open the rib and groove elements. The separator 9 is of novel construction and as shown in FIG. 2 has a configuration in vertical cross-section corresponding substantially to an inverted T, including a vertical portion 9a and a horizontal portion 9b. It will be seen that the vertical dimension of the vertical portion 9a of the separator is sufficiently great so as to support the horizontal portion 9b at a substantial distance below the top of the flanges 18 and 19. The purpose of this will hereinafter be pointed out. Also it will be noted that the thickness of the vertical portion 9a is sufficiently thin throughout its length so as not to spread the spacing between the flanges 18 and 19 which would cause an opening of the interlocking rib and groove elements 16 and 17. The only portion of the separator structure 9 which is effective to spread the flanges 18 and 19 and thereby cause opening of the rib and groove elements 16 and 17 is the horizontal portion 9b. As may be seen in FIG. 1 the portion 9b of the separator at the opening end 10a of the slider is sufficiently wide so as to spread the flanges 18 and 19 and thereby in turn open the rib and groove elements 16 and 17. It will be noted that the section along which FIG. 2 is taken in FIG. 1 is at a location intermediate the ends of the horizontal portion 9b of the separator. At this section as shown in FIG. 2, the width of the portion 9b is sufficiently narrow to permit the flanges 18 and 19 to be moved close together and thus close the interlocking elements 16 and 17. As may be seen in FIG. 1 the end of the zipper to the left of the slider 10 is still maintained open by the horizontal portion 9b of the separator.

As pointed out above, the flange structure 18, 19, on the strips 14, 15, has a substantial depth as shown in FIG. 1. The purpose of this is two fold. The first is to provide sufficient area to form a window structure 18a and 19a therein for receiving the horizontal portion 9b of the separator. The second is to provide sufficient plastic material so that when the flanges 18 and 19 and the rib and groove elements 16 and 17 are vertically sealed together at the ends of the pair of strips, the zipper 11 will be maintained closed at those ends and will provide integrated end stops 23 for the zipper slider. It will be understood that the flange structure and rib and groove elements at the opposite ends of the strips, not shown, are also vertically sealed together to provide an integrated end stop at the opposite end of the zipper for the slider. The window structure 18a and 19a is framed within the flange structure 18 and 19 and is located beneath the top thereof and above the rib and groove elements 16 and 17 adjacent the end stop 23. The window structure 18a, 19a is dimensioned to receive the separator portion 9b at the opening end 10a of the slider 10, FIG. 3, whereby when the slider 10 is moved in the zipper closing direction, the interlocking rib and groove elements 16 and 17 are closed throughout the length of the strips 14 and 15 by the closing end 10b of the slider and the separator portion 9b at the opening end of the slider is received in the window structure 18a, 19a. This is best shown in FIGS. 3-5. It will be seen that the separator portion 9b, since it extends into the windows 18a, 19a, is now ineffective on the flange structure 18 and 19 to maintain open the interlocking rib and groove elements 16 and 17 thereby preventing leakage through the zipper.

Referring to FIG. 5 it will be seen that the separator portion 9b is positioned at the end of the zipper in the windows 18a, 19a of the flanges 18 and 19. Thus the slider 10 is in the fully closed position for the zipper 11. In order to aid in the release of the separator structure 9 from the window structure 18a, 19a, the forward end of the portion 9b is shaped at 9c as by a curve or chamfer to aid in separating the flanges 18 and 19 as the slider 10 is moved in an opening direction on the zipper. Thus the window structure 18a, 19a creates a "detente" effect on the slider when in the closed position.

In the aforesaid U.S. Pat. Nos. 5,067,208 and 5,161,286 additional end clamps or clips were utilized at the ends of the zipper to ensure that the bag was leakproof. In those applications, each flange was about 0.060" high and they were located above each of the interlocking elements. The interlocking elements were opened with a separator finger on the slider extending about 0.050" down between the flanges. In the present invention the height of each flange 18, 19 is increased up to 0.500" and the depth of the slider separator structure 9 is increased up to 0.500" and is flared out at the bottom 9b to be received in the window structure 18a, 19a in the flanges. By increasing the height of the flanges 18, 19, there is adequate plastic material in them to form integrated end stop seals 23 at the ends of the zipper. These end seals 23 are sufficiently strong to provide a leakproof closure at the ends of the zipper without requiring additional end clips or clamps as disclosed in the aforesaid U.S. Pat. Nos. 5,067,208 and 5,161,286. The use of windows 18a, 19a in the flanges as distinguished from a notch or slit as disclosed in the aforesaid U.S. Pat. Nos. 5,067,208 and 5,020,194 maintains the integrity of the flange structure adjacent the end seals and aids in ensuring the leakproof closure of the zipper. The side seal flanges 23 and the extended separator structure 9 provide an end stop to the slider 10 at both ends of the bag.

The present invention has various advantages over the prior art. For example in manufacture, the cost of the extra plastic end straps is eliminated, several of the heat sealing operations are eliminated, and the station for applying the plastic end straps is eliminated. Registration is less critical during the movement of the bag web through the bag making machine and the appearance of the finished bag is also improved.

While a preferred embodiment of the invention has been described and illustrated, it is to be understood that further modifications thereof may be made within the scope of the appended claims without departing from the spirit of the invention.

What is claimed is:

1. A leakproof plastic zipper with integrated end stops for a zipper slider particularly suited for thermoplastic bags and the like comprising a pair of flexible plastic strips having separable fastener means extending along the length thereof comprising reclosable interlocking rib and groove profile elements on the respective strips, said strips each including profiled flange structure extending along the length thereof parallel to the rib and groove elements, a straddling slider on said strips for closing or opening the reclosable rib and groove elements comprising an inverted U-shaped plastic member having a back for moving along the top edges of the flange structure with depending side walls projecting therefrom for maintaining said flange structure and said rib and groove elements therebetween, said slider including separator structure depending from said back and inserted between said flange structure to open said rib and groove elements, said sidewalls extending from an opening end of the slider to a closing end, the sidewalls being spaced wider apart at the opening end to permit separation of the rib and groove elements and being spaced sufficiently close together at the closing end to press the rib and groove elements into interlocking relationship as the slider is moved in a zipper closing direction, said flange structure and said rib and groove elements being vertically sealed together at both ends of said pair of strips to maintain the zipper closed at said ends and to provide integrated end stops for the zipper slider, and window structure in said flange structure beneath the top thereof and above said rib and groove elements and adjacent one of said end stops, said window structure being dimensioned to receive said separator structure at the opening end of said slider whereby when said slider is moved in the zipper closing direction, said interlocking rib and groove elements are closed throughout the length of said strips by said closing end of said slider and said separator structure at said opening end of said slider is received in said window structure and thus is ineffective on said flange structure to maintain open said interlocking rib and groove elements thereby to prevent leakage through said zipper.

2. A leakproof plastic zipper according to claim 1 wherein said separator structure depending from said back of said slider has a configuration in vertical cross-section corresponding substantially to an inverted T, the horizontal portion of said T having the ends thereof adapted to be received in said window structure.

3. A leakproof plastic zipper according to claim 2 wherein said horizontal portion of said T is shaped to aid in release of said T shaped portion of said slider from said window structure when said slider is moved in the zipper opening direction.

4. A leakproof plastic zipper according to claim 2 wherein the vertical portion of said T has a thickness less than the normal spacing between said flanges when said interlocking rib and groove elements of the zipper are closed.

* * * * *